United States Patent
Rogg et al.

(10) Patent No.: US 11,383,321 B2
(45) Date of Patent: Jul. 12, 2022

(54) LASER CUTTING OF METAL-CERAMIC SUBSTRATES

(71) Applicant: Heraeus Deutschland GmbH & Co. KG, Hanau (DE)

(72) Inventors: Alexander Rogg, Trabitz (DE); Bogdan Lisca, Sanmihaiu Roman (RO)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 103 days.

(21) Appl. No.: 16/624,074

(22) PCT Filed: Jun. 21, 2018

(86) PCT No.: PCT/EP2018/066593
§ 371 (c)(1),
(2) Date: Dec. 18, 2019

(87) PCT Pub. No.: WO2018/234457
PCT Pub. Date: Dec. 27, 2018

(65) Prior Publication Data
US 2020/0398372 A1 Dec. 24, 2020

(30) Foreign Application Priority Data

Jun. 21, 2017 (EP) .................................. 17177113

(51) Int. Cl.
*B23K 26/0622* (2014.01)
*B23K 26/402* (2014.01)
(Continued)

(52) U.S. Cl.
CPC ........ *B23K 26/0624* (2015.10); *B23K 26/402* (2013.01); *C04B 37/02* (2013.01);
(Continued)

(58) Field of Classification Search
CPC .......................... B23K 26/0624; H05K 3/0029
See application file for complete search history.

(56) References Cited

U.S. PATENT DOCUMENTS

| 7,202,141 B2 | 4/2007 | Park et al. |
| 2003/0213770 A1* | 11/2003 | Yamada .............. C03C 23/0025 216/65 |

(Continued)

FOREIGN PATENT DOCUMENTS

| CN | 1457225 | 11/2003 |
| CN | 1973375 | 5/2007 |

(Continued)

OTHER PUBLICATIONS

Written Opinion and International Search Report for PCT International Application No. PCT/EP2018/066593 dated Jan. 2, 2020.

(Continued)

*Primary Examiner* — Binh X Tran
(74) *Attorney, Agent, or Firm* — Dicke, Billig & Czaja, PLLC

(57) ABSTRACT

The present application relates to a method of laser ablation of a metal-ceramic substrate, in which a laser is used under process conditions in which the formation of solid metal particles on the metal-ceramic substrate, which can separate from metal particles released by laser ablation near the ablation edge, is essentially avoided. Further the present application relates to a ceramic-metal substrate comprising a ceramic substrate and a metallization on at least one side of the ceramic substrate, wherein the ceramic substrate and the metallization have flush cutting edge.

8 Claims, 1 Drawing Sheet

(51) Int. Cl.
   *C04B 37/02* (2006.01)
   *H05K 3/00* (2006.01)
   *H05K 1/03* (2006.01)
   *B23K 103/18* (2006.01)
   *B23K 103/12* (2006.01)
   *B23K 103/00* (2006.01)
   *H05K 3/08* (2006.01)

(52) U.S. Cl.
   CPC ......... *H05K 1/0306* (2013.01); *H05K 3/0029* (2013.01); *B23K 2103/12* (2018.08); *B23K 2103/18* (2018.08); *B23K 2103/52* (2018.08); *C04B 37/026* (2013.01); *C04B 2237/30* (2013.01); *C04B 2237/32* (2013.01); *C04B 2237/40* (2013.01); *C04B 2237/50* (2013.01); *H05K 1/03* (2013.01); *H05K 3/08* (2013.01)

(56) References Cited

U.S. PATENT DOCUMENTS

| | | |
|---|---|---|
| 2011/0177292 A1 | 7/2011 | Teshima et al. |
| 2012/0267774 A1 | 10/2012 | Ewe et al. |
| 2013/0078408 A1 | 3/2013 | Niino et al. |
| 2014/0353362 A1* | 12/2014 | Ovtchinnikov ..... H01S 5/02345 228/170 |
| 2017/0120390 A1 | 5/2017 | Seet et al. |
| 2017/0338169 A1* | 11/2017 | Mahler ............... H01L 21/0217 |
| 2019/0001442 A1* | 1/2019 | Unrath ................. B23K 26/703 |
| 2019/0009362 A1* | 1/2019 | Wacker ................. B23K 26/40 |
| 2019/0193445 A1* | 6/2019 | Harrison ............... B41M 5/262 |

FOREIGN PATENT DOCUMENTS

| | | |
|---|---|---|
| CN | 102026770 | 4/2011 |
| CN | 102132635 | 7/2011 |
| CN | 103862179 | 6/2014 |
| CN | 104105353 | 10/2014 |
| CN | 105345277 | 2/2016 |
| JP | 2017-080796 | 5/2017 |
| WO | 2011/149097 | 12/2011 |

OTHER PUBLICATIONS

Written Opinion and International Search Report for PCT International Application No. PCT/EP2018/066593 dated Sep. 19, 2018.

* cited by examiner

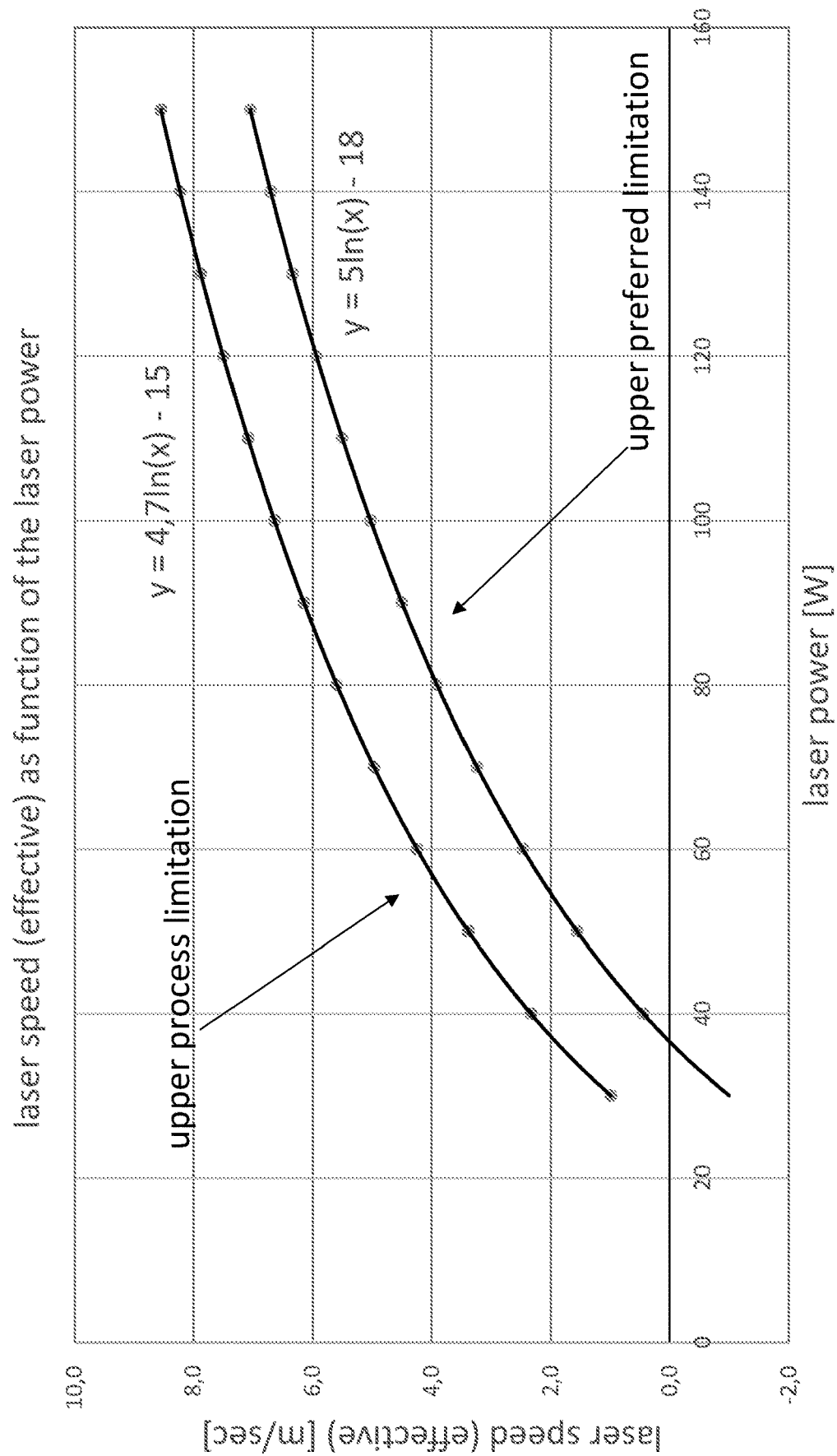

LASER CUTTING OF METAL-CERAMIC SUBSTRATES

CROSS REFERENCE TO RELATED APPLICATION

This Utility Patent Application claims priority under 35 U.S.C. § 371 to International Application Serial No. PCT/EP2018/066593, filed Jun. 21, 2018, which claims the benefit of European Patent Application No. EP 17177113.2, filed Jun. 21, 2017; which are both incorporated herein by reference.

The present invention relates to a method of laser cutting of metal-ceramic substrates. A further subject of the present invention is a metal-ceramic substrate obtained by the method according to the invention and the use of a laser for cutting of metal-ceramic substrates.

Laser cutting, also known as laser beam cutting, refers to the separation of solids by means of continuous or pulsed laser radiation through material ablation. Nearly every type of material, for example metals, dielectrics and organic materials, can be cut by laser radiation according to the state of the art. One problem that arises particularly when cutting metal materials with laser beams is particulate emissions, which can lead to undesirable metal deposits near the laser cutting line. Corresponding deposits are particularly troublesome in the processing of copper layers in electronic components, for example in DCB substrates. These deposits can cause a reduction of the electrical insulation and a reduction of the isolation distance, which can ultimately lead to the destruction of the circuit based on the DCB substrate.

Direct Copper Bonding Substrates (DCB, also called DBC) are the most widely used circuit carriers for power electronics applications. DCB technology is a joining technology by which a eutectic bond is produced between copper (usually copper foil) and ceramic at high temperatures. The DCB substrates are suitable for high power applications that require good thermal decoupling.

DCBs consist of a ceramic substrate such as $Al_2O_3$ (or other ceramic materials such as ZTA, AlN, silicon nitride ($Si_3N_4$)), which serves as an insulating layer, and copper compounds to ensure electrical conductivity. The DCB substrate is the backbone of the power electronic modules and is extremely powerful, for example compared to a printed circuit board (PCB). Firstly, it carries the semiconductor chips and serves to dissipate heat. On the other hand, it ensures the insulation towards the heat sink and the inverter housing.

For optimum reliability and performance, the module must have good properties in terms of heat distribution and resistance to temperature and load reversal stability. At this, delamination phenomena of the individual layers pose a particular challenge.

Metal-ceramic substrates, which are obtained, for example, by the DCB process, usually have functional recesses. These are, for example, holes, through which the metal-ceramic substrates are fastened by screwing, or through-hole plating (vias).

The insertion of such recesses is usually carried out by etching away the metal coating and subsequently cutting through the ceramic substrate, for example by laser ablation. This results in edge structures of the metal-ceramic substrates, in which the metal edge is set back relative to the ceramic edge.

A metal edge which is set back relative to the ceramic edge has the disadvantage that the resulting metal-ceramic substrates are less stable and delamination of the metal layer from the substrate may occur during temperature and load change. Another disadvantage of metal edge which is set back is the reduced mechanical stability of the ceramic substrate, which can be manifested by the formation of cracks, for example.

Moreover, the conventional introduction of recesses into the metal-ceramic substrate requires a two-step process of etching away the metal coating and laser ablation of the ceramic substrate as described above, which is disadvantageous from an economic point of view.

Starting from this prior art, the present invention initially has the object to provide a method for laser ablation of metal-ceramic substrates, with which metal-ceramic substrates with recesses in the metal layer and/or the ceramic substrate can be provided, which have a stable electrical insulation.

Another object of the present invention is to provide a metal-ceramic substrate provided with recesses in the metal layer and/or the ceramic substrate, which is preferably mechanically stable and has preferably no cracks.

The method of laser ablation of metal-ceramic substrates, comprising a ceramic substrate and at least one metal layer provided thereon, is intended to enable economical production of the metal-ceramic substrates.

These objects are achieved by a method for ablation of a metal-ceramic substrate. The method according to the invention is characterized in that the method is carried out with a laser that is used under process conditions in which the formation of solid metal particles on the metal-ceramic substrate, which can separate from metal particles released by laser ablation near the ablation edge, is essentially avoided.

Furthermore, the objects are preferably achieved by a method of ablation of a metal-ceramic substrate using a laser which is used under process conditions that permit simultaneous laser ablation of a metal layer and a ceramic substrate.

When the method according to the invention is carried out under process conditions in which the formation of solid metal particles on the metal-ceramic substrate, which can separate from metal particles released by laser ablation near the ablation edge, is essentially avoided, a metal-ceramic substrate with stable insulation properties is obtained, since the insulation properties are not disturbed by the deposition of metal particles on the metal-ceramic substrate.

When the method according to the invention is carried out under process conditions in which the simultaneous laser ablation of a metal layer and a ceramic substrate is possible, on the one hand an economical method which requires further method steps is avoided and at the same time a metal-ceramic substrate is obtained having a flush edge of the metallization and the ceramic substrate. As a result, a metal-ceramic substrate is provided which is mechanically stable and avoids delamination of the metal layer from the substrate during temperature and load changes.

The metal-ceramic substrate processed by the method according to the invention is essentially free of metal particles on the sides of the edge formed by laser ablation. In the context of the present invention, the term "essentially free of metal particles" is to be understood to mean that the residues of the metal particles formed by laser ablation are so low that the insulation properties of the metal-ceramic substrate are not impaired to an extent which interferes the use of the metal-ceramic substrate as a circuit carrier for power electronics applications.

In particular, the method according to the invention is based on the fact that metal particles through laser ablation on the sides of the edge formed by laser ablation are essentially avoided. In the context of the present invention, the region "on the sides of the edge formed by laser ablation" is to be understood in particular as the region of the metal-ceramic substrate on which the deposition of metal particles occurs when other than the process conditions according to the invention are used.

The deposits extend in the recess and/or in a region essentially parallel to the respective edges of the recesses produced by laser ablation in a width, calculated from the edge of the recess, of generally at most 200 µm, preferably at most 100 µm, preferably at most 50 µm, preferably at most 45 µm, more preferably at most 40 µm, more preferably at most 35 µm, even more preferably at most 30 µm.

This range relates to the recess created in the metal-ceramic substrate by the laser ablation. Therefore, in the context of the present invention, the term "essentially free of metal particles on the sides of the edge formed by laser ablation" ("near the ablation edge") is understood to mean that less than 50% of the surface area, preferably less than 40% of the surface area, more preferably less than 20% of the surface area, more preferably less than 10% of the surface area, more preferably less than 5% of the surface area, is covered with metal particles generated by laser ablation in the aforementioned width range.

In the following, preferred embodiments of the laser are described with which the formation of metal particles at the laser ablation of metal-ceramic substrates can be essentially prevented and with which a simultaneous laser ablation of a metal layer and a ceramic substrate is possible.

In the context of the present invention, the laser may be selected from an n-sec laser, p-sec laser or f-sec laser, although according to the invention the use of a p-sec laser is preferred.

Furthermore, it is further preferred if the p-sec laser has a pulse duration, i.e. a duration of the laser pulse of preferably 0.1 to 100 ps, more preferably 0.5 to 50 ps, still more preferably 1 to 30 ps. With the selected pulse duration, it is possible to guide the laser process so that essentially no residues of the metal occur, and thus essentially no metal particles, which are deposited on the surface of the metal-ceramic substrate, are formed. Since, in the context of the present invention, essentially only cold dusts and no melting phases are formed, and because of a sufficiently large selected distance from the beam source to the substrate surface, the use of a process gas is possible, but not absolutely necessary.

The processing speed of the laser is preferably at least 0.2 m/sec, more preferably at least 0.50 m/sec, more preferably at least 0.60 m/sec, more preferably at least 0.70 m/sec, more preferably at least 0.80 m/sec, more preferably at least 1.00 m/sec.

The processing speed of the laser is preferably at most 10.00 m/sec, more preferably at most 8.00 m/sec, more preferably at most 6.00 m/sec, more preferably at most 5.00 m/sec, more preferably at most 4.00 m/sec.

The processing speed of the laser is preferably 0.50 to 10.00 m/sec, more preferably 0.60 to 8.00 m/sec, more preferably 0.70 to 6.00 m/sec, further preferably 0.80 to 5.00 m/sec, more preferably 1.00 to 4.00 m/sec.

In the present invention it was further found out that there exists a technical relationship between the laser power (W=Watt) and the maximum processing speed of the laser (m/sec), whereby the processing speed is defined as the effective laser speed (in the present invention, the effective laser speed is the effective laser speed applied during ablation (as compared with the relative laser speed which considers the numbers of crossings (effective laser speed=relative laser speed/crossings over the metallization)).

In the present invention, the effective laser speed (real laser speed) is defined, but the numerical results of the present invention are also valid for the relative laser speed in case more than one crossing over the metallization is carried out.

In a preferred embodiment of the present invention, it has been found out that the effective maximum processing speed of the laser and the laser power follows the following relationship:

$$y \leq 4.7 \ln x - 15 \quad (1)$$

with x=laser power in W; and y=maximum laser processing speed (effective) in m/sec.

This relationship means that the maximum processing speed y of the laser by a given laser power fulfils preferably the above-mentioned requirement (1).

In a more preferred embodiment of the present invention, it has been found out that the effective maximum processing speed of the laser and the laser power in general follows the following relationship:

$$y \leq 5.0 \ln x - 18 \quad (2)$$

with x=laser power in W; and y=maximum laser processing speed (effective) in m/sec.

This relationship means that the maximum processing speed y of the laser by a given laser power fulfils more preferably the above-mentioned requirement (2).

The lowest processing speed of the laser is as preferably mentioned above: The processing speed of the laser is preferably at least 0.20 m/sec, more preferably at least 0.50 m/sec, more preferably at least 0.60 m/sec, more preferably at least 0.70n/sec, more preferably at least 0.80 m/sec, more preferably at least 1.00 in/sec.

Thus, there are preferred embodiments of the present invention which are summarized in the following table:

| Lowest processing speed of the laser (m/sec) | Highest processing speed of the laser (m/sec) |
| --- | --- |
| 0.20 | $y \leq 4.7 \ln x - 15$ |
| 0.50 | $y \leq 4.7 \ln x - 15$ |
| 0.60 | $y \leq 4.7 \ln x - 15$ |
| 0.70 | $y \leq 4.7 \ln x - 15$ |
| 0.80 | $y \leq 4.7 \ln x - 15$ |
| 1.00 | $y \leq 4.7 \ln x - 15$ |
| 0.20 | $y \leq 5.0 \ln x - 18$ |
| 0.50 | $y \leq 5.0 \ln x - 18$ |
| 0.60 | $y \leq 5.0 \ln x - 18$ |
| 0.70 | $y \leq 5.0 \ln x - 18$ |
| 0.80 | $y \leq 5.0 \ln x - 18$ |
| 1.00 | $y \leq 5.0 \ln x - 18$ | with x=laser power in W; and y=maximum laser processing speed (effective).

In detail, further preferred embodiments are covered by the claimed invention in case different, but fixed laser powers are applied as follows:

Lowest processing speed of the laser: 0.2 m/sec

| Laser power (W) | Lowest processing speed of the laser (m/sec) | Highest processing speed of the laser (m/sec) |
|---|---|---|
| 40 | 0.20 | 2.30 |
| 50 | 0.20 | 3.40 |
| 60 | 0.20 | 4.20 |
| 70 | 0.20 | 5.00 |
| 80 | 0.20 | 5.60 |
| 90 | 0.20 | 6.10 |
| 100 | 0.20 | 6.60 |
| 110 | 0.20 | 7.10 |
| 120 | 0.20 | 7.50 |
| 130 | 0.20 | 7.90 |
| 140 | 0.20 | 8.20 |
| 150 | 0.20 | 8.50 |

Lowest processing speed of the laser: 0.5 m/sec

| Laser power (W) | Lowest processing speed of the laser (m/sec) | Highest processing speed of the laser (m/sec) |
|---|---|---|
| 40 | 0.50 | 2.30 |
| 50 | 0.50 | 3.40 |
| 60 | 0.50 | 4.20 |
| 70 | 0.50 | 5.00 |
| 80 | 0.50 | 5.60 |
| 90 | 0.50 | 6.10 |
| 100 | 0.50 | 6.60 |
| 110 | 0.50 | 7.10 |
| 120 | 0.50 | 7.50 |
| 130 | 0.50 | 7.90 |
| 140 | 0.50 | 8.20 |
| 150 | 0.50 | 8.50 |

Lowest processing speed of the laser: 0.60 m/sec

| Laser power (W) | Lowest processing speed of the laser (m/sec) | Highest processing speed of the laser (m/sec) |
|---|---|---|
| 40 | 0.60 | 2.30 |
| 50 | 0.60 | 3.40 |
| 60 | 0.60 | 4.20 |
| 70 | 0.60 | 5.00 |
| 80 | 0.60 | 5.60 |
| 90 | 0.60 | 6.10 |
| 100 | 0.60 | 6.60 |
| 110 | 0.60 | 7.10 |
| 120 | 0.60 | 7.50 |
| 130 | 0.60 | 7.90 |
| 140 | 0.60 | 8.20 |
| 150 | 0.60 | 8.50 |

Lowest processing speed of the laser: 0.70 m/sec

| Laser power (W) | Lowest processing speed of the laser (m/sec) | Highest processing speed of the laser (m/sec) |
|---|---|---|
| 40 | 0.70 | 2.30 |
| 50 | 0.70 | 3.40 |
| 60 | 0.70 | 4.20 |
| 70 | 0.70 | 5.00 |
| 80 | 0.70 | 5.60 |
| 90 | 0.70 | 6.10 |
| 100 | 0.70 | 6.60 |
| 110 | 0.70 | 7.10 |
| 120 | 0.70 | 7.50 |
| 130 | 0.70 | 7.90 |
| 140 | 0.70 | 8.20 |
| 150 | 0.70 | 8.50 |

Lowest processing speed of the laser: 0.80 m/sec

| Laser power (W) | Lowest processing speed of the laser (m/sec) | Highest processing speed of the laser (m/sec) |
|---|---|---|
| 40 | 0.80 | 2.30 |
| 50 | 0.80 | 3.40 |
| 60 | 0.80 | 4.20 |
| 70 | 0.80 | 5.00 |
| 80 | 0.80 | 5.60 |
| 90 | 0.80 | 6.10 |
| 100 | 0.80 | 6.60 |
| 110 | 0.80 | 7.10 |
| 120 | 0.80 | 7.50 |
| 130 | 0.80 | 7.90 |
| 140 | 0.80 | 8.20 |
| 150 | 0.80 | 8.50 |

Lowest processing speed of the laser: 1.00 m/sec

| Laser power (W) | Lowest processing speed of the laser (m/sec) | Highest processing speed of the laser (m/sec) |
|---|---|---|
| 40 | 1.00 | 2.30 |
| 50 | 1.00 | 3.40 |
| 60 | 1.00 | 4.20 |
| 70 | 1.00 | 5.00 |
| 80 | 1.00 | 5.60 |
| 90 | 1.00 | 6.10 |
| 100 | 1.00 | 6.60 |
| 110 | 1.00 | 7.10 |
| 120 | 1.00 | 7.50 |
| 130 | 1.00 | 7.90 |
| 140 | 1.00 | 8.20 |
| 150 | 1.00 | 8.50 |

Moreover, much further preferred embodiments are covered by the claimed invention in case different, but fixed laser powers are applied as follows:

Lowest processing speed of the laser: 0.2 in/sec

| Laser power (W) | Lowest processing speed of the laser (m/sec) | Highest processing speed of the laser (m/sec) |
|---|---|---|
| 40 | 0.20 | 1.00 |
| 50 | 0.20 | 1.60 |
| 60 | 0.20 | 2.50 |
| 70 | 0.20 | 3.20 |
| 80 | 0.20 | 3.90 |
| 90 | 0.20 | 4.50 |
| 100 | 0.20 | 5.00 |
| 110 | 0.20 | 5.50 |
| 120 | 0.20 | 5.90 |
| 130 | 0.20 | 6.30 |

| Laser power (W) | Lowest processing speed of the laser (m/sec) | Highest processing speed of the laser (m/sec) |
|---|---|---|
| 140 | 0.20 | 6.70 |
| 150 | 0.20 | 7.10 |

Lowest processing speed of the laser: 0.50 m/sec

| Laser power (W) | Lowest processing speed of the laser (m/sec) | Highest processing speed of the laser (m/sec) |
|---|---|---|
| 40 | 0.50 | 1.00 |
| 50 | 0.50 | 1.60 |
| 60 | 0.50 | 2.50 |
| 70 | 0.50 | 3.20 |
| 80 | 0.50 | 3.90 |
| 90 | 0.50 | 4.50 |
| 100 | 0.50 | 5.00 |
| 110 | 0.50 | 5.50 |
| 120 | 0.50 | 5.90 |
| 130 | 0.50 | 6.30 |
| 140 | 0.50 | 6.70 |
| 150 | 0.50 | 7.10 |

Lowest processing speed of the laser: 0.60 m/sec

| Laser power (W) | Lowest processing speed of the laser (m/sec) | Highest processing speed of the laser (m/sec) |
|---|---|---|
| 40 | 0.60 | 1.00 |
| 50 | 0.60 | 1.60 |
| 60 | 0.60 | 2.50 |
| 70 | 0.60 | 3.20 |
| 80 | 0.60 | 3.90 |
| 90 | 0.60 | 4.50 |
| 100 | 0.60 | 5.00 |
| 110 | 0.60 | 5.50 |
| 120 | 0.60 | 5.90 |
| 130 | 0.60 | 6.30 |
| 140 | 0.60 | 6.70 |
| 150 | 0.60 | 7.10 |

Lowest processing speed of the laser: 0.70 m/sec

| Laser power (W) | Lowest processing speed of the laser (m/sec) | Highest processing speed of the laser (m/sec) |
|---|---|---|
| 40 | 0.70 | 1.00 |
| 50 | 0.70 | 1.60 |
| 60 | 0.70 | 2.50 |
| 70 | 0.70 | 3.20 |
| 80 | 0.70 | 3.90 |
| 90 | 0.70 | 4.50 |
| 100 | 0.70 | 5.00 |
| 110 | 0.70 | 5.50 |
| 120 | 0.70 | 5.90 |
| 130 | 0.70 | 6.30 |
| 140 | 0.70 | 6.70 |
| 150 | 0.70 | 7.10 |

Lowest processing speed of the laser: 0.80 m/sec

| Laser power (W) | Lowest processing speed of the laser (m/sec) | Highest processing speed of the laser (m/sec) |
|---|---|---|
| 40 | 0.80 | 1.00 |
| 50 | 0.80 | 1.60 |
| 60 | 0.80 | 2.50 |
| 70 | 0.80 | 3.20 |
| 80 | 0.80 | 3.90 |
| 90 | 0.80 | 4.50 |
| 100 | 0.80 | 5.00 |
| 110 | 0.80 | 5.50 |
| 120 | 0.80 | 5.90 |
| 130 | 0.80 | 6.30 |
| 140 | 0.80 | 6.70 |
| 150 | 0.80 | 7.10 |

Lowest processing speed of the laser: 1.60 m/sec

| Laser power (W) | Lowest processing speed of the laser (m/sec) | Highest processing speed of the laser (m/sec) |
|---|---|---|
| 40 | 1.00 | 1.00 |
| 50 | 1.00 | 1.60 |
| 60 | 1.00 | 2.50 |
| 70 | 1.00 | 3.20 |
| 80 | 1.00 | 3.90 |
| 90 | 1.00 | 4.50 |
| 100 | 1.00 | 5.00 |
| 110 | 1.00 | 5.50 |
| 120 | 1.00 | 5.90 |
| 130 | 1.00 | 6.30 |
| 140 | 1.00 | 6.70 |
| 150 | 1.00 | 7.10 |

According to the invention, it has been found that the formation of metal particles deposited on the surface of the metal-ceramic substrate can generally not be avoided at too low processing speeds, in particular at processing speeds of the laser below 0.5 m/s. Therefore, processing speeds of the laser of more than 0.5 m/s are preferred according to the invention.

The metal particles generated by the laser ablation can be deposited in the context of the present invention both on the metallization and on the ceramic substrate.

In the method according to the invention, it is possible to cut through the metal-ceramic substrate in one crossing or in several crossings of the laser.

Thereby, it is possible to cut through only the metallization as well as the metallization and the metal-ceramic substrate.

The pulse energy, i.e. the energy content of a single laser pulse is preferably 10 to 500 µJ, more preferably 50 to 400 µJ, even more preferably 100 to 350 µJ.

The p-sec laser preferably has a power of 20 to 400 W, more preferably 40 to 200 W, even more preferably 50 to 180 W, still more preferably 60 to 160 watts, still more preferably 80 to 130 watts, still more preferably 90 to 120 watts.

In a preferred embodiment of the present invention, the laser used is an IR laser.

The underlying tasks of the present invention are in particular solved by the use of an IR laser, more preferably a p-sec IR laser, wherein, without being bound by theory, it is assumed that the light of the p-sec IR beam is particularly effective coupled into the surface of the ceramic substrate or in the surface of the metal coating, i.e. it is absorbed by the ceramic substrate or the metal coating particularly effective. In addition, an IR laser has high energy efficiency, which is also advantageous for solving the above tasks.

A further advantage of using an IR laser for processing metal materials of the metal-ceramic substrate is that the IR laser light can be generated directly from diode light, whereas green laser light is generated at first from IR laser light with an efficiency of 60% and UV laser light in turn must be generated of green laser light with a further efficiency of also 60%.

The p-sec IR laser in contrast to, for example, a $CO_2$ laser, can be arranged significantly further away from the metal material to be processed, as a result of which a higher depth of focus can be realized.

In addition, by means of an IR laser, a sufficiently high depth of focus can be achieved compared to a $CO_2$ laser.

When an IR laser is used in the present invention, the frequency of the IR laser is preferably 350 to 650 kHz, more preferably 375 to 625 kHz, still more preferably 400 to 600 kHz.

When an IR laser is used in the present invention, the pulse energy of the IR laser is preferably 100 to 300 µJ, more preferably 125 to 275 µJ, still more preferably 150 to 250 µJ.

The method according to the invention can be carried out in the presence of a process gas. The process gas is, for example, oxygen.

The method according to the invention is preferably performed in a device having a suction device that absorbs dusts caused by the laser processing.

Partly there is a need to introduce contours in the metal material of a metal-ceramic substrate, which differ from a straight line. These may be, for example, holes or roundings at the corners of the metal material. Such contours can be obtained by cutting the metal material by using the laser in the method according to the invention. It is also possible to produce corresponding contours in a metal-ceramic substrate by laser ablation of the metal material and the ceramic material.

If in the context of the present invention, the metal material of the metal-ceramic material is severed using the laser, the cutting edges have an angle which deviates usually at most 30°, more preferably at most 25° from a right angle formed by a perpendicular to the metal layer or the metal-ceramic substrate. This results in a hole that is larger on the top of the laser entrance than on the bottom.

A further advantage of the inventive separation of the metal material and the ceramic material of a metal-ceramic substrate with an IR laser, in particular p-sec-IR laser, is that at the bottom, i.e. the laser exit side, no burrs formed by melting phase are resulting, which would have to be removed in an additional procedural step.

Considering the above-described embodiments, it is possible to process the metal coating and the ceramic substrate with the same laser and under the same process parameters. As a result, a production of metal-ceramic substrates with structured metal coating can be realized cost-effectively. In detail it is possible, I) to ablate only partially the upper metal coating or cut through to the ceramic and, for example, to produce fine structures in the metal coating, which are not possible with an etching process;

II) to cut through the metal coating and the ceramic substrate up to the lower metal coating (Thus, the basis for through hole can be created. When filling appropriate blind holes with a conductive material, a through hole is made. Filling material is, for example, metallic pastes, metallic moldings, for example cylinders, or galvanically generated materials.);

III) to cut through the metal coating and ceramic substrate completely in order to produce functional recesses, e.g. for screwing.

The process parameters according to the invention are suitable for the simultaneous laser ablation of metallization and ceramic substrate.

In a preferred embodiment, only the metallization, in particular of copper, is ablated in the present invention.

The inventive method of laser ablation of a metal-ceramic substrate can be carried out in the presence of a process gas, wherein for example, oxygen or compressed air can be used as process gas. As stated above, the use of a process gas is not mandatory, but may be advisable to protect the beam source from contamination. In this case, the use of compressed air would be the preferred alternative.

Since in the method according to the invention, dusts are produced by the laser processing, it is particularly preferred if the device used has a suction device that absorbs dusts which are produced by the laser processing.

The suction device can be formed, for example, by a suctioning tube or a suction box surrounding the projected laser light and whose lower edge is at a distance from the surface of the metal-ceramic substrate of preferably 0.5 to 10 cm, more preferably 0.75 to 7.5 cm, more preferably 1 to 5 cm.

The laser ablation of a metal-ceramic substrate in the context of the present invention can be carried out, for example, by the action of the laser beam on the metal surface of the metal-ceramic substrate. This reduces the formation of metal particles that deposit on the surfaces of the metal-ceramic substrate by choosing the above process parameters.

The laser ablation of a metal-ceramic substrate in the context of the present invention can also take place, for example, by the action of the laser beam on the ceramic substrate. This approach is preferred if a recess for fastening the metal-ceramic substrate is to be generated through the laser ablation, since in this case the means used for fastening (e.g. screw) is mainly in contact with the metal material and thus flaking of the ceramic material due to stress with the fastening means is reduced.

Another object of the present invention is a metal-ceramic substrate, which is obtained by the method described above. This metal-ceramic substrate has in particular a flush edge with respect to the metal layer and ceramic layer on a recess produced by laser ablation. A recess may in this case also be a terminal edge of a metal-ceramic substrate.

The term "flush edge of the metal layer and the ceramic substrate" is understood in the context of the present invention to mean that the metal edge and the edge of the ceramic substrate have a maximum offset parallel to the edge of preferably maximum 20 µm, more preferably maximum 15 µm, more preferably maximum 10 µm, even more preferably maximum 5 µm.

The metal-ceramic substrate of the present invention may have a contour obtained by the treatment with the IR laser, which deviates from a straight line and which has been formed by cutting the ceramic substrate using a laser beam. Moreover, it is possible that the metal-ceramic substrate according to the invention exhibits holes and/or roundings at the corners, which have been produced due to cutting through the ceramic substrate.

The metal-ceramic substrate obtained by the IR laser method with a p-sec IR laser, has cutting edges at an angle which deviates from a right angle by preferably at most 30°, more preferably at most 25°. If holes are introduced into the metal-ceramic substrate by the IR laser method, their size may be different on the two sides of the ceramic substrate. However, preferably, the metal-ceramic substrate exhibits at the hole and/or at the rounding, no burr.

Due to the IR laser method according to the invention, metal-ceramic substrates are obtainable which have a coding on the metal coating of the ceramic substrate. This coding is preferably effected by ablation of the metal coating by the IR laser.

With the method according to the invention, moreover, metal-ceramic substrates are obtainable in which the metallization on the ceramic substrate has at least one edge attenuation or in which the metallization has at least one recess for receiving electronic components, in particular chips, wherein the recess was generated by a laser treatment.

The ceramic-metal substrate according to the invention is preferably a DCB substrate (direct copper bonded substrate), an AMB substrate (active metal brazing substrate) or a DAB substrate (direct aluminum bonded substrate). In a further embodiment of the present invention, the ceramic-metal substrate may be a ceramic-metal substrate according to the prior art, not previously published international patent application PCT/EP2016/082161.

In the following, the ceramic substrate to be preferably used in the context of the present invention is described in more detail:

The ceramic substrate preferably contains at least one compound selected from the group consisting of metal oxides, semi-metal nitrides and metal nitrides.

The metal oxides and metal nitrides are preferably selected from the group consisting of aluminum oxide, aluminum nitride and silicon nitride.

The at least one compound preferably has grain sizes in the range from 0.01 μm to 100 μm.

In particular, the at least one compound is aluminum oxide, wherein the aluminum oxide has more preferably grain sizes in the range from 0.01 μm to 25 μm.

Furthermore, the at least one compound preferably has a number distribution of grain sizes with a median value $d_{50}$ and an arithmetic mean value $d_{arith}$, whereby the ratio of do to $d_{arith}$ is preferably in the range of 0.50 to 1.50, preferably in the range of 0, 75 to 1.10, more preferably in the range of 0.78 to 1.05, particularly preferably in the range of 0.80 to 1.00.

More preferably, the at least one compound is aluminum oxide and the aluminum oxide preferably has a number distribution of grain sizes with a median value $d_{50}$ and an arithmetic mean value $d_{arith}$, whereby the ratio of $d_{50}$ to $d_{arith}$ is preferably in the range of 0.75 to 1.10, preferably in the range of 0.78 to 1.05, even more preferably in the range of 0.80 to 1.00.

In the context of the present invention, these values are not to be regarded as strict upper and lower limits for the grain size distribution, but may vary by +/−10%. In a preferred embodiment, however, it is the lower limit, which is not undercut, and upper limits, which is not exceeded.

As is well known to the person skilled in the art, the determination of the grain size distribution may be made by reference to the number of grains (i.e., number distribution) or alternatively by reference to mass (i.e., mass distribution) or volume of the grains. In the context of the present invention, the distribution of the grain sizes is determined on the basis of the number of grains.

As generally known, characteristic values of a grain size distribution include its $d_{50}$ value, $d_5$ value and $d_{95}$ value. For the $d_{50}$ value, which is often referred to as the median value, 50% of the grains have a diameter smaller than the de value.

The arithmetic mean value $d_{arith}$ of a grain size distribution results from the sum of the grain sizes of the individual grains divided by the number of grains.

The symmetry of a grain size distribution can be expressed by the ratio of median $d_5$ to the arithmetic mean $d_{arith}$ of that distribution (i.e., by the quotient $d_{50}/d_{arith}$, also referred to as the symmetry value of a grain size number distribution). The closer the value of this quotient is to 1.0, the more symmetrical the grain size distribution.

The expert is familiar with suitable methods for adjusting the symmetry of the grain size distribution in the ceramic substrate, in particular aluminum oxide, for example during the production of the starting substrate. For example, the symmetry of the grain size distribution can be influenced by sintering duration and sintering temperature during the production of the starting substrate.

This invention also relates to the use of a laser with the aforementioned features for ablation of a metal-ceramic substrate.

In all embodiments mentioned above, preferably a DCB substrate is used.

EXAMPLES

The present invention is further explained by reference to the following examples which illustrate the present invention.

Several DCB substrates are prepared according to a standard procedure known to the person skilled in the art. An $Al_2O_3$ ceramic is used as the substrate and a copper foil is used to prepare the metallic coating on the substrate.

The $Al_2O_3$ ceramic substrate is used with a thickness of between 0.25 and 0.40 mm, whereas the metallic copper coating is used with a thickness of between 0.38 to 0.63 mm.

The experiment are performed with the following set of parameters for the laser:

Laser output power variable up to 100 W

Laser source: IR

Pulse length: 0.1 to 100 ps

Pulse energy: 10 to 500 μJ

Spot diameter 30 μm

Frequency laser: 350 to 650 kHz

In the experiments the metal (copper) on the ceramic substrate ($Al_2O_3$) is ablated.

The resulting metal ceramic substrates are evaluated as follows:

| | |
|---|---|
| n.e. | not economical |
| +++ | Very good appearance, almost no residues, very low roughness, almost no copper oxidation |
| ++ | Good appearance, slightly residues, low roughness, low copper oxidation |
| + | Appearance useable, visible residues, visible roughness, noticeable copper oxidation |
| − | Quality not acceptable, technically functionable, optical appearance bad |
| extra | Extrapolated |
| Unusable | Process limitation, not usable |

| Laser speed (m/sec) | Laser power (W) | | | | | | | | | |
|---|---|---|---|---|---|---|---|---|---|---|
| | 30 | 40 | 50 | 60 | 70 | 80 | 90 | 100 | 120 | 150 |
| 0.25 | +++ | ++ | + | − | − | − | − | − | | |
| 0.50 | | +++ | ++ | ++ | + | + | − | − | | |
| 0.75 | | +++ | ++ | ++ | ++ | ++ | + | + | − | − |
| 1.00 | unusable | | +++ | +++ | +++ | ++ | ++ | + | + | − |
| 1.50 | unusable | | +++ | +++ | +++ | +++ | ++ | + | | |
| 2.00 | unusable | | +++ | +++ | +++ | +++ | ++ | ++ | extra | |
| 3.00 | unusable | unusable | +++ | +++ | +++ | +++ | +++ | ++ | extra | extra |
| 4.00 | unusable | unusable | unusable | +++ | +++ | +++ | +++ | +++ | extra | extra |
| 5.00 | unusable | unusable | unusable | unusable | +++ | +++ | +++ | +++ | extra | extra |
| 6.00 | unusable | unusable | unusable | unusable | unusable | unusable | unusable | unusable | +++ | ++ |

The above-shown table evidences that the appearance of metal ceramic substrates on which the metal (copper) was ablated is improved from right to left (which means from a high laser power to a low laser power and from a low laser speed to a high laser speed), On the other hand, an economic reasonable processing results in the above-shown table from left to right (which means with a lower number of laser passages over the metal ceramic substrate).

The values indicated bold are preferred.

Based on data provided in the above-shown table, a mathematical relationship between laser power (W) and laser speed (m/sec, effective) can be derived.

The diagram in FIG. 1 shows the same relationship between laser power (W) and laser speed (m/sec): In this diagram of FIG. 1 the unusable combinations of laser power and laser speed and the preferred range (+ to +++ and extra) are presented as a logarithmic function, which is defined as follows:

$$y \leq 4.7 \ln x - 15 \quad \text{General acceptable range:}$$

$$y \leq 5.0 \ln x - 18, \quad \text{Preferred range:}$$

with
x = laser power in W; and
y = laser speed (effective).

This means: With a laser power of 100 W a laser speed according to the present invention is less than 6.6 m/sec (general acceptable range) and 5.0 m/sec (preferred range).

Taking this relationship between laser power and laser speed (effective) Into consideration, further examples are carried out and result into the following findings:

| | Laser processing speed [m/sec] | |
|---|---|---|
| Laser power | Process limitation | Preferred range for the process (maximum speed) |
| 30 | 1.0 | |
| 40 | 2.3 | 0.4 |
| 50 | 3.4 | 1.6 |
| 60 | 4.2 | 2.5 |
| 70 | 5.0 | 3.2 |
| 80 | 5.6 | 3.9 |
| 90 | 6.1 | 4.5 |
| 100 | 6.6 | 5.0 |
| 110 | 7.1 | 5.5 |
| 120 | 7.5 | 5.9 |
| 130 | 7.9 | 5.3 |
| 140 | 8.2 | 6.7 |
| 150 | 8.5 | 7.1 |

Based on the above findings the following statements can be derived:

(1) Laser Power

Preferred are laser powers of 30 W or more.

Further preferred are laser powers of 60 W or more (for economic reasons).

More preferred are laser powers of 80 W or more.

(2) Laser Speed

Preferred are laser speeds (effective) of 0.2 m/sec or more.

Further preferred are laser speeds of 0.5 m/sec or more.

More preferred are laser speeds of 0.75 m/sec or more.

The above-presented results are based on the following examples:

First Example—According to the Present Invention a. Parameters as mentioned above
b. Laser power 70 Watt
c. Laser speed (effective): 1.0 m/sec
d. Ceramic thickness 0.63 mm; copper thickness 0.30 mm
e. Results:
　i. Good optical appearance
　ii. Only few melting phases; only few copper oxidation
　iii. A low optical roughness of the surface
　iv. Processing speed acceptable Second Example—According to the Invention a. Parameters as mentioned above
b. Laser power 100 Watt
c. Laser speed (effective): 1.5 m/sec
d. Ceramic thickness 0.38 mm; copper thickness 0.30 mm
e. Results:
　i. Acceptable optical appearance
　ii. More melting phases and copper oxidation
　iii. Higher optical roughness of the surface
　iv. Processing speed low Third Example—According to the Invention a. Parameters as mentioned above
b. Laser power: 50 Watt
c. Laser speed (effective): 3.0 m/sec
d. Ceramic thickness 0.63 mm; copper thickness 0.25 mm
e. Results:
　i. A very good optical appearance
　ii. Almost no melting phases and copper oxidation
　iii. Almost no optical roughness of the surface
　iv. Processing speed very low; for economical reason this procedure is less suitable.

Forth Example—not According to the Invention a. Parameters as mentioned above
b. Laser power: 60 Watt
c. Laser speed (effective): 6 m/sec
d. Ceramic thickness 0.38 mm; copper thickness 0.20 mm
e. Results:
   i. The copper is ablated very slowly
   ii. The processing speed is too low
   iii. Almost no residues
   iv. Very low optical roughness of the surface
   v. Processing speed so low that for economical reason the process cannot be applied Fifth Example—According to the Invention a. Parameters as mentioned above
b. Laser power 90 Watt
c. Laser speed (effective): 0.25 m/sec
d. Ceramic thickness 0.63 mm; copper thickness 0.30 mm
e. Results:
   i. Many melt phases remain on the surface
   ii. Copper is oxidized in a high degree
   iii. Almost no residues
   iv. A very high optical roughness of the surface
   v. For application with low requirements of the quality a parameter area is given with high economic efficiency Sixth Example—not According to the Invention a. Parameters as mentioned above
b. Laser power: 100 Watt
c. Laser speed (effective): 0.15 m/sec
d. Ceramic thickness 0.63 mm; copper thickness 0.40 mm
e. Result:
   i. The Quality of the copper ablation is very bad; no use of these process parameters is expected
   ii. The material becomes very warm during processing
   iii. Process parameters are technically not feasible

The invention claimed is:

1. A method for ablation of a metal-ceramic substrate, comprising:
ablating the metal-ceramic substrate with a laser;
wherein the laser is used under process conditions such that less than 50% of the surface area near the ablation edge of the metal-ceramic substrate is covered with metal particles, wherein the area near the ablation edge has a width, calculated from the edge of the recess, of at most 200 µm;
wherein the laser is used with a relationship between the laser power (W) and the effective maximal processing speed of the laser (m/sec) which corresponds to the following formula (1):

$$y \leq 4.7 \ln x - 15 \qquad (1)$$

wherein
x=laser power in W;
y=effective maximal laser processing speed in m/sec; and
wherein the laser power x is between 40 W and 200 W.

2. The method according to claim 1, wherein the laser is used with a relationship between the laser power (W) and the effective maximal processing speed of the laser (m/sec), which corresponds to the following formula (2):

$$y \leq 5.0 \ln x - 18 \qquad (2)$$

wherein
x=laser power in W; and
y=effective maximal laser processing speed in m/sec.

3. The method according to claim 1, wherein the effective processing speed of the laser is at least 0.50 m/sec.

4. The method according to claim 1, wherein the metal is a copper layer or copper foil, which is applied onto a ceramic substrate.

5. The method according to claim 1, wherein the metal-ceramic substrate is a DCB substrate.

6. The method according to claim 1, wherein the laser is a p-sec laser having a pulse duration of 0.10 to 100.00 ps.

7. The method according to claim 6, wherein the p-sec laser has a pulse energy of 10.00 to 500.00 µJ.

8. The method according to claim 6, wherein the p-sec laser is an IR-P-sec laser.

* * * * *